(12) United States Patent
Kusakabe et al.

(10) Patent No.: US 9,099,505 B2
(45) Date of Patent: Aug. 4, 2015

(54) THERMAL PROCESSING APPARATUS AND COOLING METHOD

(75) Inventors: Yoshinori Kusakabe, Oshu (JP); Kenichi Yamaga, Oshu (JP)

(73) Assignee: Tokyo Electron Limited, Minato-Ku (JP)

( * ) Notice: Subject to any disclaimer, the term of this patent is extended or adjusted under 35 U.S.C. 154(b) by 1205 days.

(21) Appl. No.: 12/881,556

(22) Filed: Sep. 14, 2010

(65) Prior Publication Data

US 2011/0076632 A1 Mar. 31, 2011

(30) Foreign Application Priority Data

Sep. 26, 2009 (JP) ................................. 2009-221697

(51) Int. Cl.
| F27D 15/02 | (2006.01) |
| F28D 15/00 | (2006.01) |
| C23C 16/46 | (2006.01) |
| H01L 21/67 | (2006.01) |
| C30B 25/10 | (2006.01) |
| C30B 35/00 | (2006.01) |

(52) U.S. Cl.
CPC .......... *H01L 21/67109* (2013.01); *C30B 25/10* (2013.01); *C30B 35/00* (2013.01)

(58) Field of Classification Search
None
See application file for complete search history.

(56) References Cited

U.S. PATENT DOCUMENTS

| 2,440,052 | A | * | 4/1948 | Lingen et al. | 236/9 A |
| 3,172,647 | A | * | 3/1965 | Remmey | 432/47 |
| 4,225,121 | A | * | 9/1980 | Meyer et al. | 266/130 |
| 4,740,157 | A | * | 4/1988 | D'Agrosa | 432/14 |
| 5,088,922 | A | * | 2/1992 | Kakizaki et al. | 432/152 |
| 5,249,960 | A | * | 10/1993 | Monoe | 432/77 |
| 5,360,336 | A | * | 11/1994 | Monoe | 432/5 |
| 5,500,388 | A | * | 3/1996 | Niino et al. | 438/482 |
| 5,507,639 | A | * | 4/1996 | Monoe | 432/77 |
| 5,525,057 | A | * | 6/1996 | Monoe | 432/77 |
| 5,578,132 | A | * | 11/1996 | Yamaga et al. | 118/724 |
| 5,593,608 | A | * | 1/1997 | Suzuki | 219/492 |
| 5,616,264 | A | * | 4/1997 | Nishi et al. | 219/494 |
| 6,036,482 | A | * | 3/2000 | Okase | 432/11 |
| 6,059,567 | A | * | 5/2000 | Bolton et al. | 432/81 |

(Continued)

FOREIGN PATENT DOCUMENTS

| JP | 08-031707 A1 | 2/1996 |
| JP | 09-190982 A1 | 7/1997 |

(Continued)

*Primary Examiner* — Alissa Tompkins
*Assistant Examiner* — Eric Gorman
(74) *Attorney, Agent, or Firm* — Burr & Brown, PLLC

(57) ABSTRACT

A thermal processing apparatus including: a cylindrical processing vessel; a support unit to be loaded into and unloaded from the vessel; and a heating furnace surrounding an outer periphery of the vessel, with a cooling space therebetween. The furnace is connected to a cooling-gas introduction unit, including a gas introduction passage to which a blowing fan is connected, for introducing a cooling gas into the cooling space during a temperature lowering operation after a thermal process. The furnace is connected to a cooling-gas discharge unit, including a heat exchanger, a suction fan, and a gas discharge passage, for discharging the cooling gas of a raised temperature from the cooling space. Connected to the gas discharge passage at a position upstream of the heat exchanger is a temperature-lowering gas introduction unit for introducing a temperature-lowering gas to the cooling gas of a raised temperature so as to lower its temperature.

18 Claims, 7 Drawing Sheets

(56) References Cited

U.S. PATENT DOCUMENTS

| | | | | |
|---|---|---|---|---|
| 6,159,298 A * | 12/2000 | Saito | | 118/715 |
| 6,322,631 B1 * | 11/2001 | Okase | | 118/708 |
| 6,332,724 B1 * | 12/2001 | Yano et al. | | 396/611 |
| 7,432,475 B2 * | 10/2008 | Nakajima et al. | | 219/390 |
| 7,700,156 B2 * | 4/2010 | Aoki et al. | | 427/248.1 |
| 7,753,678 B2 * | 7/2010 | Teeter et al. | | 432/176 |
| 7,907,406 B1 * | 3/2011 | Campbell et al. | | 361/699 |
| 2002/0025688 A1 * | 2/2002 | Kato | | 438/758 |
| 2004/0025516 A1 * | 2/2004 | Van Winkle | | 62/3.3 |
| 2004/0035569 A1 * | 2/2004 | Suenaga et al. | | 165/228 |
| 2005/0121432 A1 * | 6/2005 | Saito et al. | | 219/390 |
| 2006/0156980 A1 * | 7/2006 | Won et al. | | 118/715 |
| 2006/0258170 A1 * | 11/2006 | Saito et al. | | 438/758 |
| 2006/0280670 A1 * | 12/2006 | Teeter et al. | | 423/445 R |
| 2008/0182345 A1 * | 7/2008 | Sugishita et al. | | 438/7 |
| 2009/0029486 A1 * | 1/2009 | Ueno et al. | | 438/5 |
| 2009/0095422 A1 * | 4/2009 | Sugishita et al. | | 156/345.27 |
| 2009/0181547 A1 * | 7/2009 | Okuda et al. | | 438/758 |
| 2009/0197352 A1 * | 8/2009 | Ueno et al. | | 438/5 |
| 2011/0223693 A1 * | 9/2011 | Sugishita | | 438/5 |
| 2012/0094483 A1 * | 4/2012 | Komiya | | 438/653 |
| 2012/0118534 A1 * | 5/2012 | Goth et al. | | 165/104.13 |
| 2012/0120603 A1 * | 5/2012 | Campbell et al. | | 361/698 |
| 2014/0069111 A1 * | 3/2014 | Campbell et al. | | 62/3.2 |
| 2014/0287375 A1 * | 9/2014 | Kosugi et al. | | 432/233 |

FOREIGN PATENT DOCUMENTS

| | | |
|---|---|---|
| JP | 11-260725 A1 | 9/1999 |
| JP | 2002-110576 A1 | 4/2002 |
| JP | 2008-078196 A1 | 4/2008 |

\* cited by examiner

THERMAL PROCESSING APPARATUS AND COOLING METHOD

CROSS REFERENCE TO RELATED APPLICATIONS

This application is based upon the prior Japanese Patent Application No. 2009-221697 filed on Sep. 26, 2009, the entire contents of which are incorporated herein by reference.

BACKGROUND OF THE INVENTION

1. Field of the Invention

The present invention relates to a batch-type thermal processing apparatus configured to thermally process objects to be processed, such as semiconductor wafers, and a cooling method.

2. Description of Related Art

In general, when semiconductor devices are manufactured, semiconductor wafers of silicon substrates are repeatedly subjected to various processes such as a film-deposition process, an etching process, an oxidation and diffusion process, and an annealing process. When a thermal process such as a film-deposition process is performed by a batch-type thermal processing apparatus capable of simultaneously processing a plurality of semiconductor wafers, it is necessary to cool high-temperature semiconductor wafers as fast as possible, while preventing damages such as slips on the semiconductor wafer, in order to improve a product throughput.

For this purpose, the following thermal processing apparatus is proposed as a conventional batch-type thermal processing apparatus. Namely, in response to the finish of a thermal process of semiconductor wafers, a cooling air is allowed to flow through a space on an outer peripheral side of a vertical processing vessel containing therein the semiconductor wafers. Thus, heat is rapidly drawn from the processing vessel at a high temperature of, e.g., about 800° C. to 1000° C., whereby the high-temperature processed semiconductor wafers can be rapidly cooled (for example, Patent Documents 1 to 5).

The cooling air is sent by a blowing fan to the cooling space around a sidewall of the processing vessel, and is sucked from the cooling space by a suction fan. In this case, although depending on the process manner, the temperature of the cooling air having cooled the processing vessel is raised to reach a temperature as high as about 400° C. to 500° C., and thus the cooling air becomes a high-temperature air. When the high-temperature air directly flows into the suction fan, the suction fan is thermally damaged. Thus, a heat exchanger is disposed on an upstream side of the suction fan, so as to cool the high-temperature air to a predetermined lower temperature such as 50° C., in order that the blowing fan is not thermally damaged.

Patent Documents

[Patent Document 1] JP08-031707A
[Patent Document 2] JP09-190982A
[Patent Document 3] JP11-260725A
[Patent Document 4] JP2002-110576A
[Patent Document 5] JP2008-078196A In the above thermal processing apparatus, the air at a high temperature of about 400° C. to 500° C. does not flow into the suction fan, but flows into the heat exchanger disposed on the upstream side of the fan. For this reason, the structure of the heat exchanger itself should be resistive to a high temperature so as to improve a heat resistance of the heat exchanger. Thus, the heat exchanger should be made of a special material and have a special structure, whereby a size of the heat exchanger is enlarged and a cost thereof is increased.

SUMMARY OF THE INVENTION

The present invention has been made in view of the aforementioned problems so as to effectively solve the same. A first object of the present invention is to provide a thermal processing apparatus and a cooling method, which eliminate the use of a special, expensive heat exchanger resistive to a high temperature, and enable the use a versatile, inexpensive heat exchanger having a lower heat resistance, by mixing a temperature-lowering gas with a cooling gas whose temperature has been raised by a heat exchange with respect to a processing vessel, at a position on an upstream side of a heat exchanger, so as to lower a temperature of the mixed gas.

A second object of the present invention is to provide a thermal processing apparatus and a cooling method, which eliminate the use of a special, expensive heat exchanger resistive to a high temperature, and enable the use a versatile, inexpensive heat exchanger having a lower heat resistance, by bypassing a part of a cooling air toward a processing vessel, and mixing the bypassed cooling gas with a cooling gas whose temperature has been raised by a heat exchange with respect to the processing vessel, at a position on an upstream side of a heat exchanger, so as to lower the temperature of the mixed gas.

The present invention is a thermal processing apparatus configured to thermally process a plurality of objects to be processed, the thermal processing apparatus comprising: a processing vessel; a support unit capable of being moved to be loaded into and unloaded from the processing vessel, while supporting the plurality of objects to be processed; a heating furnace disposed outside the processing vessel to surround the processing vessel, with a cooling space through which a gas can pass, being defined between the heating furnace and the processing vessel; a cooling-gas introduction unit disposed on the heating furnace, the cooling-gas introduction unit including a blowing fan and a gas introduction passage, for introducing a cooling gas for cooling the processing vessel into the cooling space; a cooling-gas discharge unit disposed on the heating furnace, the cooling-gas discharge unit including a gas discharge passage, a heat exchanger, and a suction fan, for discharging the cooling gas of a raised temperature from the cooling space; and a temperature-lowering gas introduction unit disposed between the cooling space and the heat exchanger.

The present invention is the thermal processing apparatus wherein: the heating furnace is disposed on an outer peripheral side of the processing vessel to surround the processing vessel, with the cooling space of a predetermined width being defined between the heating furnace and the processing vessel; the heat exchanger and the suction fan of the gas discharge passage are arranged in this order from an upstream side to a downstream side; and the temperature-lowering-gas introduction unit is disposed on the gas discharge passage at a position on an upstream side of the heat exchanger, and is configured to introduce a temperature-lowering gas to be mixed with the cooling gas of a raised temperature so as to lower a temperature thereof.

The present invention is the thermal processing apparatus wherein the temperature-lowering-gas introduction unit includes: a temperature-lowering-gas introduction passage connected to the gas discharge passage; a valve disposed on the temperature-lowering-gas introduction passage, the valve being configured to control a flow of the temperature-lowering gas; a gas-temperature measuring unit disposed on the gas discharge passage at a position on an upstream side of the heat exchanger, the gas-temperature measuring unit being configured to measure a temperature of a gas flowing into the heat exchanger; and a valve controller configured to control the valve such that a temperature of the gas flowing into the heat exchanger becomes a predetermined temperature or less, based on a measured temperature value of the gas-temperature measuring unit.

The present invention is the thermal processing apparatus wherein the valve is an opening and closing valve whose valve opening degree can be adjusted.

The present invention is the thermal processing apparatus wherein a mixer is disposed on a connection position at which the gas discharge passage and the temperature-lowering-gas introduction passage are connected to each other.

The present invention is the thermal processing apparatus wherein the temperature-lowering-gas introduction unit includes: a temperature-lowering-gas introduction passage connected to the gas discharge passage; a fan for lowering temperature connected to the temperature-lowering-gas introduction passage; a valve disposed on the temperature-lowering-gas introduction passage, the valve being configured to control a flow of the temperature-lowering gas; and a valve controller configured to control the valve such that a temperature of the gas flowing into the heat exchanger becomes a predetermined temperature or less, based on a preset time period in which a start of a cooling operation is determined as a starting point.

As described above, in the thermal processing apparatus configured to thermally process a plurality of objects to be processed at the same time, the temperature-lowering gas is mixed with the cooling gas whose temperature has been raised by the heat exchange with the processing vessel, at a position on the upstream side of the heat exchanger. Thus, the use of a special, expensive heat exchanger resistive to a high temperature is eliminated, and it is possible to use a versatile, inexpensive heat exchanger having a lower heat resistance.

The present invention is a thermal processing apparatus configured to thermally process a plurality of objects to be processed, the thermal processing apparatus comprising: a processing vessel; a support unit capable of being moved to be loaded into and unloaded from the processing vessel, while supporting the plurality of objects to be processed; a heating furnace disposed outside the processing vessel to surround the processing vessel, with a cooling space through which a gas can pass being defined between the heating furnace and the processing vessel; a cooling-gas introduction unit disposed on the heating furnace, the cooling-gas introduction unit including a blowing fan and a gas introduction passage, for introducing a cooling gas for cooling the processing vessel into the cooling space; a cooling-gas discharge unit disposed on the heating furnace, the cooling-gas discharge unit including a gas discharge passage, a heat exchanger, and a suction fan, for discharging the cooling gas of a raised temperature from the cooling space; and a bypass unit configured to communicate the gas introduction passage and the gas discharge passage so as to bypass a part of the cooling gas.

The present invention is the thermal processing apparatus wherein: the heating furnace is disposed on an outer peripheral side of the processing vessel to surround the processing vessel, with the cooling space of a predetermined width being defined between the heating furnace and the processing vessel; and the heat exchanger and the suction fan of the gas discharge passage are arranged in this order from an upstream side to a downstream side.

The present invention is the thermal processing apparatus wherein: the bypass unit includes: a bypass passage that communicates a downstream side of the blowing fan of the gas introduction passage and an upstream side of the heat exchanger disposed on the gas discharge passage with each other; a valve disposed on the bypass passage; the valve being configured to control a flow of a bypassed gas; a gas-temperature measuring unit configured to measure a temperature of a gas flowing into the heat exchanger; and a valve controller configured to control the valve such that a temperature of the gas becomes a predetermined temperature or less, based on a measured temperature value of the gas-temperature measuring unit.

The present invention is the thermal processing apparatus wherein the valve is an opening and closing valve whose valve opening degree can be adjusted.

The present invention is the thermal processing apparatus wherein a mixer is disposed on a connection position at which the gas discharge passage and the bypass passage are connected to each other.

The present invention is the thermal processing apparatus wherein the bypass unit includes: a bypass passage that communicates a downstream side of the blowing fan of the gas introduction passage and an upstream side of the heat exchanger disposed on the gas discharge passage with each other; a valve disposed on the bypass passage; the valve being configured to control a flow of a bypassed gas; and a valve controller configured to control the valve such that a temperature of a mixed gas, which is a mixture of the cooling gas having flowed through the cooling space and the gas having flowed through the bypass passage, becomes a predetermined temperature or less, based on a preset time period in which a start of a cooling operation is determined as a starting point.

As described above, in the thermal processing apparatus configured to thermally process a plurality of objects to be processed at the same time, a part of the cooling gas toward the processing vessel is bypassed, and the bypassed cooling gas is mixed with the cooling gas whose temperature has been raised by the heat exchange with the processing vessel, at a position on the upstream side of the heat exchanger. Thus, the use of a special, expensive heat exchanger resistive to a high temperature is eliminated, and it is possible to use a versatile, inexpensive heat exchanger having a lower heat resistance.

The present invention is a method of cooling a thermal processing apparatus configured to thermally process a plurality of objects to be processed, the method comprising: introducing a cooling gas into a cooling space of a predetermined width defined between a cylindrical processing vessel containing the objects to be processed and a heating furnace, the heating furnace being disposed to surround an outer peripheral side of the processing vessel for heating the objects to be processed, so as to cool the processing vessel, while discharging the cooling gas of a raised temperature; and introducing a temperature-lowering gas into the cooling gas of a raised temperature, which has been discharged from the cooling space, so as to mix the gases, whereby a temperature of the mixed gas becomes a predetermined temperature or less.

The present invention is the method of cooling a thermal processing apparatus wherein the predetermined temperature is a heat resistant temperature of a heat exchanger disposed on a downstream side along which the mixed gas flows.

The present invention is a method of cooling a thermal processing apparatus configured to thermally process a plurality of objects to be processed, the method comprising: introducing a cooling gas into a cooling space of a predetermined width defined between a cylindrical processing vessel containing the objects to be processed and a heating furnace disposed to surround an outer peripheral side of the processing vessel for heating the objects to be processed, so as to cooling the processing vessel, while discharging the cooling gas of a raised temperature; and bypassing a part of the cooling gas flowing toward the cooling space and introducing the bypassed cooling gas into the cooling gas of a raised temperature, which has been discharged from the cooling space, so as to mix the gases, whereby a temperature of the mixed gas becomes a predetermined temperature or less.

According to the thermal processing apparatus and the cooling method of the present invention, the following excellent effects can be provided.

According to the present invention, in a thermal processing apparatus configured to thermally process a plurality of objects to be processed at the same time, a temperature-lowering gas is mixed with a cooling gas whose temperature has been raised by a heat exchange with respect to a processing vessel, at a position on the upstream side of the heat exchanger. Thus, the use of a special, expensive heat exchanger resistive to a high temperature is eliminated, and it is possible to use a versatile, inexpensive heat exchanger having a lower heat resistance.

According to the present invention, in a thermal processing apparatus configured to thermally process a plurality of objects to be processed at the same time, a part of a cooling gas toward a processing vessel is bypassed, and the bypassed cooling gas is mixed with a cooling gas whose temperature has been raised by a heat exchange with the processing vessel, at a position on the upstream side of the heat exchanger. Thus, the use of a special, expensive heat exchanger resistive to a high temperature is eliminated, and it is possible to use a versatile, inexpensive heat exchanger having a lower heat resistance.

EXAMPLE FOR CARRYING OUT THE INVENTION

Examples of a thermal processing apparatus and a cooling method according to the present invention will be described herebelow with reference to the accompanying drawings.

First Example

Figure 1:
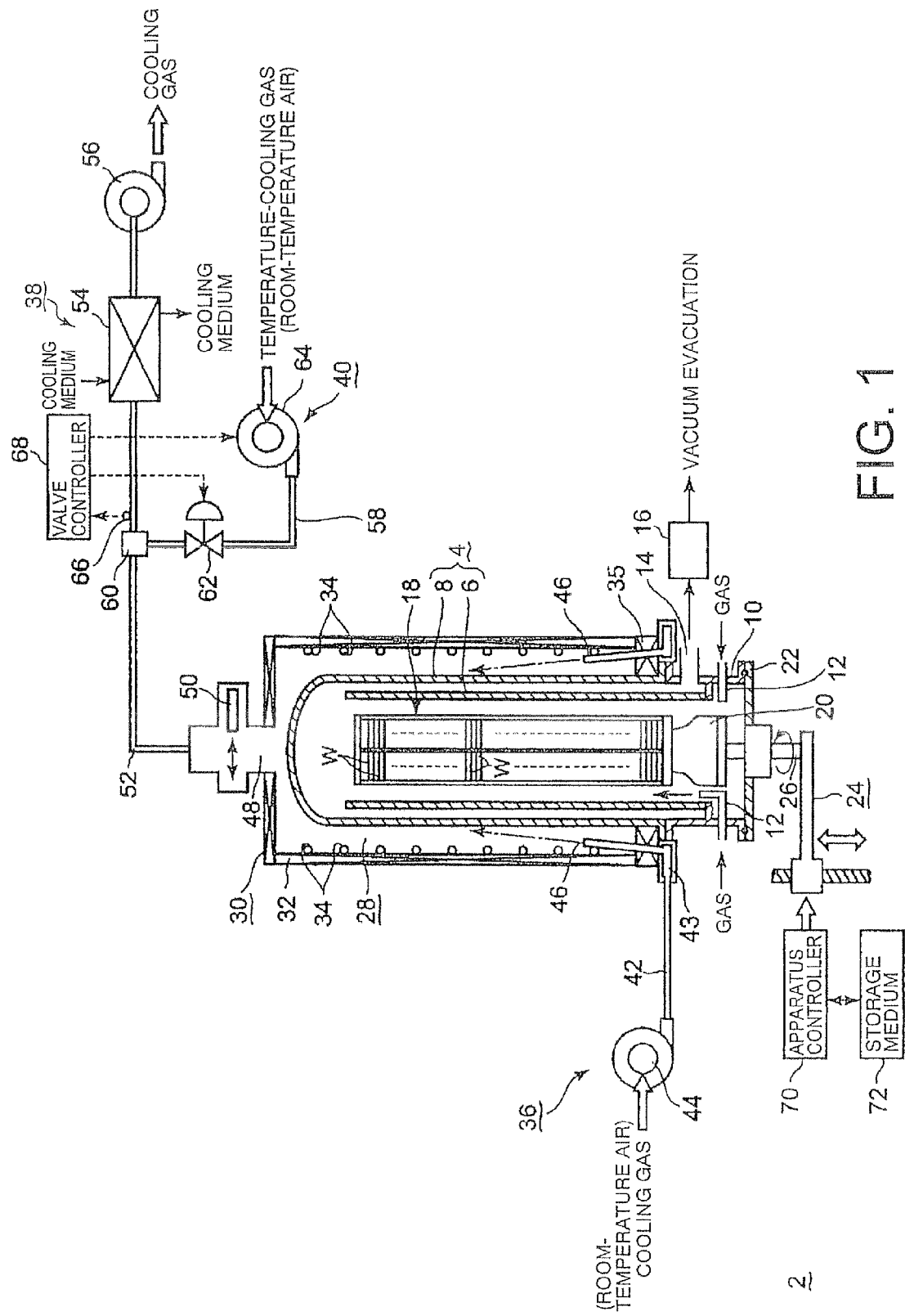
FIG. 1 is a structural view showing a first example of a thermal processing apparatus according to the present invention.

FIG. 1 is a structural view showing a first example of the thermal processing apparatus according to the present invention. As shown in FIG. 1, the thermal processing apparatus 2 includes a vertically elongated cylindrical processing vessel 4. The processing vessel 4 is of a dual tube structure, which is mainly composed of a cylindrical quartz inner tube 6, and a quartz outer tube 8 that surrounds an outside of the inner tube 6 with a predetermined distance therebetween.

An upper part of the outer tube 8 is closed to provide a ceiling, and a lower end part thereof is opened to provide an opening. For example, a cylindrical stainless-steel manifold 10 is hermetically connected to the opening. The manifold 10 is provided with a gas introduction unit 12 having a gas nozzle that introduces a required gas into the processing vessel 4, with a flow rate of the gas being controlled. A gas outlet port 14 is formed in a bottom sidewall of the outer tube 8. An exhaust system 16 having a pressure regulating valve and a vacuum pump (not shown) is connected to the gas outlet port 14.

Due to the above structure, a gas having been introduced from the bottom of the processing vessel 4 moves upward in the inner tube 6, makes a turn on the ceiling part, and flows downward through the space between the inner tube 6 and the outer tube 8 so as to be discharged from the gas outlet port 14. In this case, the inside of the processing vessel 4 may be a normal pressure atmosphere, or may be a vacuum atmosphere as shown in FIG. 1, which depends on the process manner. In addition, the manifold 10 may be omitted from the thermal processing apparatus.

In the processing vessel 4, there is disposed a support unit 18 for supporting semiconductor wafers W as objects to be processed at plural stages. The support unit 18 can be inserted into and withdrawn from the processing vessel 4 from below. The support unit 18 is formed of a quartz semiconductor wafer boat, for example, and is capable of supporting a plurality of, e.g., about 50 to 150 semiconductor wafers W at predetermined pitches in a tier-like manner. The semiconductor wafer boat is placed on a quartz insulation tube 20.

A lower end opening of the manifold 10 can be hermetically sealed by a lid 22 made of, e.g., stainless steel. The lid 22 is fixed to an elevation mechanism 24 formed of an elevator boat so that the lid 22 can be moved upward and downward (elevated and lowered). The insulation tube 20 can be rotatably supported by a rotation shaft 26 passing rotatably through the lid 22 hermetically. Thus, by moving the elevation mechanism 24 upward and downward, the support unit 18 formed of a wafer boat can be inserted into and withdrawn from the processing vessel 4 from below the processing vessel 4.

A heating furnace 30 is disposed on an outer peripheral side of the processing vessel 4 to surround the same with a predetermined space therebetween. Thus, the processing vessel 4 and the semiconductor wafers W positioned inside the heating furnace 30 can be heated by the heating furnace 30. To be specific, the heating furnace 30 has a heat-insulation member 32 disposed to surround the side part and the ceiling part of the processing vessel 4. A resistance heater 34 is arranged along substantially over all the inner wall of the heat-insulation member 32, so that the semiconductor wafers W can be heated by the heat from the resistance heater 34, as described above. The predetermined space between the processing vessel 4 and the heating furnace 30 serves as a cooling space 28.

A lower end part of the cooling space 28 is sealed by a sealing member 35, so that an inside of the cooling space 28 is hermetically closed. Connected to the heating furnace 30 are a cooling-gas introduction unit 36, a cooling-gas discharge unit 38, and a temperature-lowering-gas introduction unit 40 which is one of the characteristic features of the present invention. The cooling-gas introduction unit 36 is configured to introduce a cooling gas into the cooling space 28 in order to lower a temperature after a thermal process. The cooling-gas discharge unit 38 is configured to discharge the cooling gas of a raised temperature from the cooling space 28. The temperature-lowering-gas introduction unit 40 is configured to introduce a gas for lowering temperature (temperature-lowering gas) to the cooling gas of a raised temperature so as to lower the temperature.

Specifically, the cooling-gas introduction unit 36 has a gas-introduction passage 42 through which a cooling gas flows. A blowing fan 44 configured to send a cooling gas is connected to an upstream side of the gas-introduction passage 42. As the cooling gas, a room-temperature air can be used. A ring-shaped fan header 43 is disposed on a lower peripheral part of the processing vessel 4 and below the cooling space 28 so as to surround the same. The gas-introduction passage 42 is connected to the fan header 43. A plurality of gas nozzles 46 are extended from the fan header 43 into the cooling space 28. The gas nozzles 46 are arranged at predetermined intervals along a circumferential direction of the fan header 43. Thus, the cooling gas can be blown from the gas nozzles 46 onto the outer peripheral surface of the processing vessel 4 so as to cool the processing vessel 4.

Formed in a ceiling part of the heating furnace 30 is an outlet port 48 through which the cooling gas whose temperature has been raised by the cooling operation is discharged. The outlet port 48 is connected to an exhaust shutter 50 which is closed during a thermal process and is opened during a cooling operation. The cooling-gas discharge unit 38 has a gas discharge passage 52 connected to the outlet port 48, so that the cooling gas of a raised temperature can pass therethrough. A heat exchanger 54 and a suction fan 56 are arranged on the gas discharge passage 52 in this order from the upstream side to the downstream side thereof. A cooling medium flows through the heat exchanger 54 so as to cool the high-temperature cooling gas passing therethrough, whereby the cooling gas having been cooled to a safety temperature can be discharged outside.

The temperature-lowering-gas introduction unit 40, which is one of the characteristic features of the present invention, has a temperature-lowering-gas introduction passage 58 which is connected to the gas discharge passage 52 at a position on the upstream side of the heat exchanger 54. A mixer 60 configured to effectively mix the temperature-lowering gas and the cooling gas is disposed on a connection position at which the temperature-lowering-gas introduction passage 58 and the gas discharge passage 52 are connected to each other. The temperature-lowering-gas introduction passage 58 is equipped with a valve 62 configured to control a flow of the temperature-lowering gas. A fan for lowering temperature 64 is connected to an end of the temperature-lowering gas introduction passage 58, so that the temperature-lowering gas can be sent thereinto. As the temperature-lowering gas, a room-temperature air can be used.

A thermocouple 66 as a gas-temperature measuring unit is disposed on the gas discharge passage 52 at a position between the mixer 60 and the heat exchanger 54, whereby a temperature of a mixed gas of the cooling gas of a raised temperature and the temperature-lowering gas, which pass through the gas discharge passage 52, can be measured. Namely, the thermocouple 66 is configured to measure a temperature of the gas flowing into the heat exchanger 54.

In order to control an operation of the valve 62 and an operation of the fan for lowering temperature 64, there is disposed a valve controller 68 formed of a computer, for example. The valve controller 68 controls the opening and closing operation of the valve 62, such that a temperature of the mixed gas becomes a predetermined temperature or less, based on a measured temperature value measured by the thermocouple 66. The predetermined temperature may be a heat resistance temperature of the heat exchanger 54, e.g., 300° C.

Figure 2:
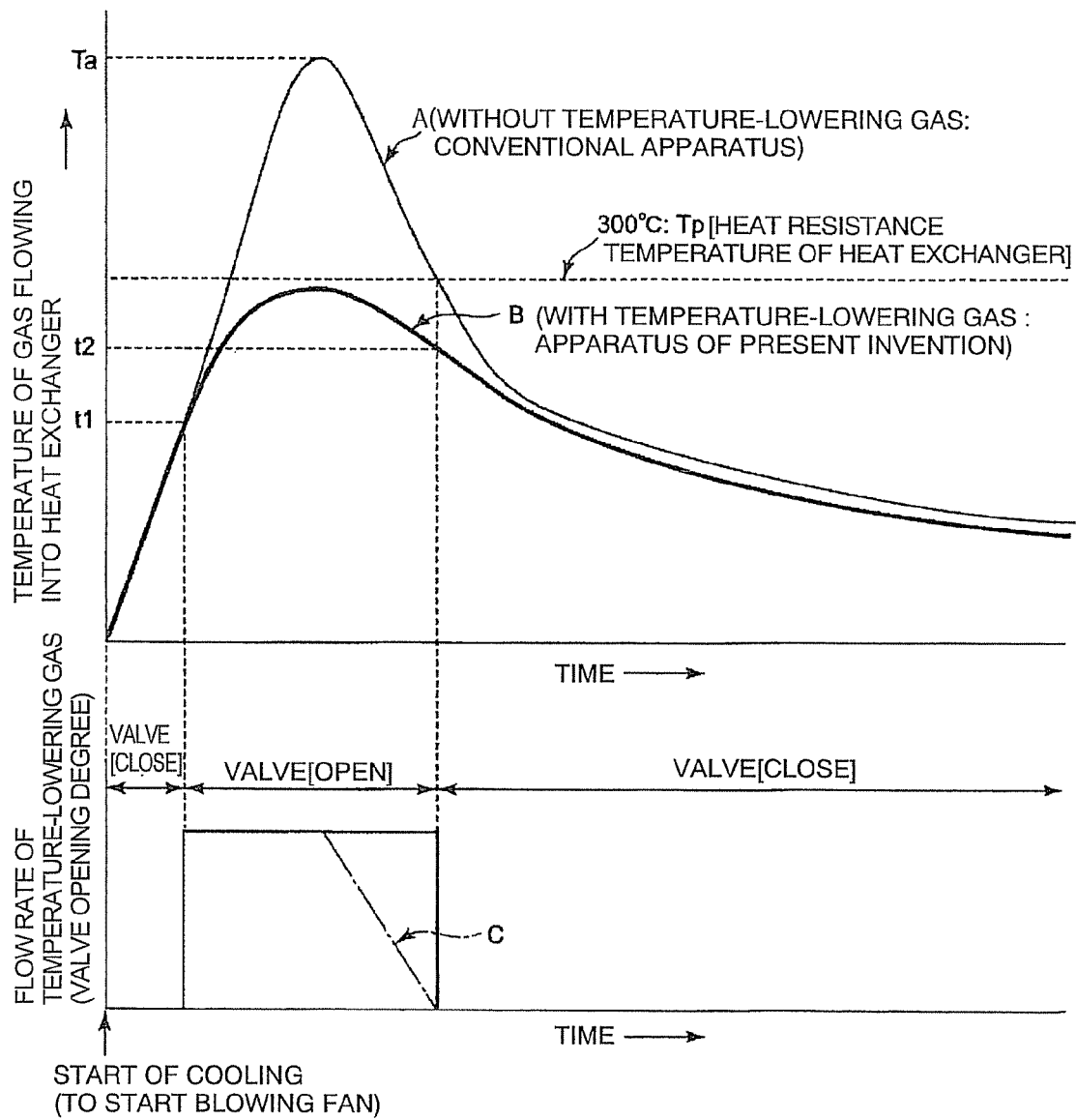
FIG. 2 is a graph showing a relationship between a temperature of a gas flowing into a heat exchanger when a processing vessel is cooled, and a flow rate of a gas for lowering temperature.

As shown in FIG. 2, in an actual control, when a temperature t1, which is slightly lower than the predetermined temperature, is measured, the temperature-lowering gas is started be introduced, and when a temperature t2 is measured after the temperature has passed the peak and is lowering, the temperature-lowering gas is stopped from being introduced.

The whole operation of the thermal processing apparatus 2 is controlled by an apparatus controller 70 formed of a computer, for example. The apparatus controller 70 is configured to perform a control of respective gases for a thermal process, a pressure control, a temperature control, and a control of operations of the respective fans 44 and 56. The apparatus controller 70 includes a storage medium 72 storing a computer-readable computer program required for the above operations. The storage medium 72 is formed of, e.g., a flexible disc, a CD (Compact Disc), a hard disc, a flash memory, or a DVD. The valve controller 68 is operated under control of the apparatus controller 70.

<Description of Cooling Method>

Figure 3:
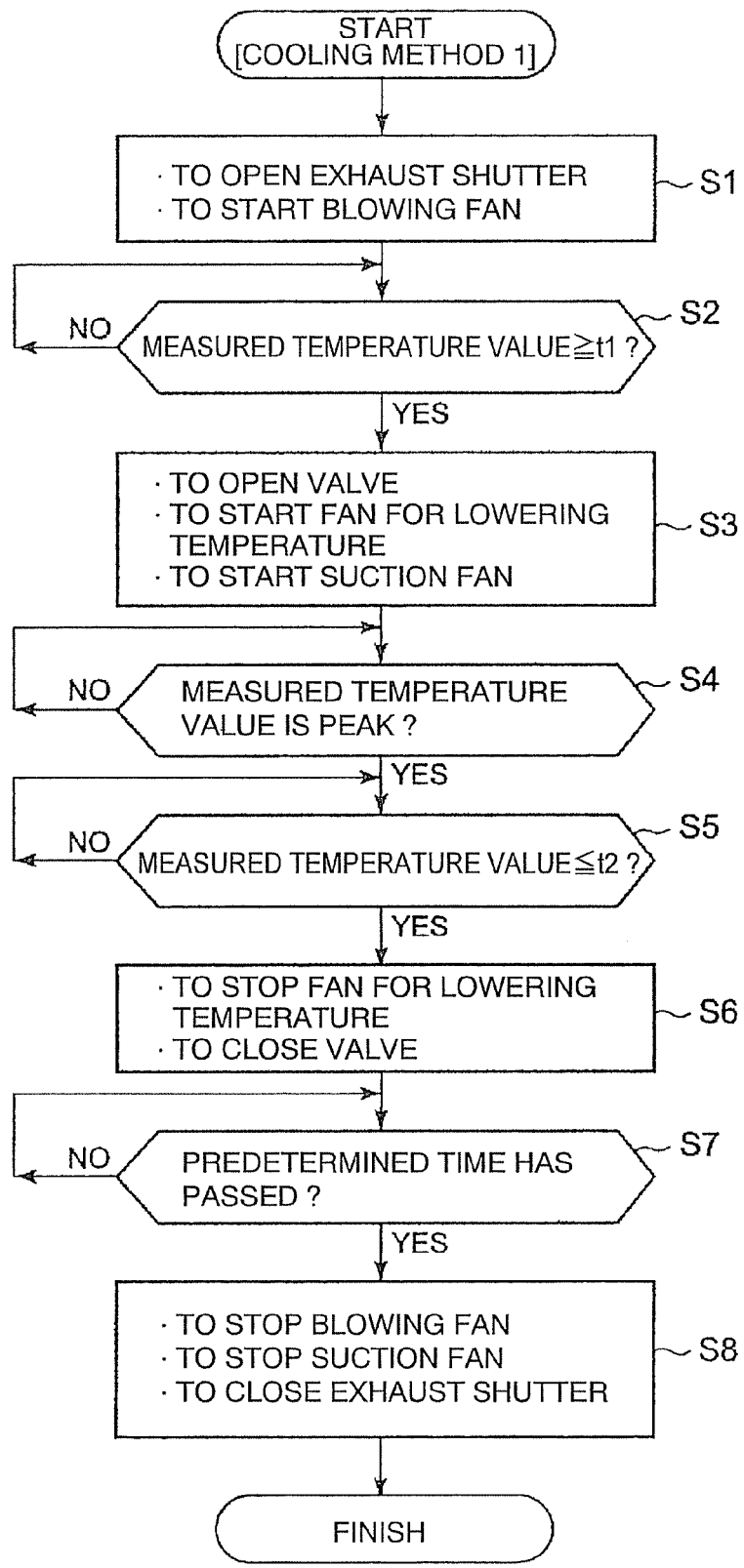
FIG. 3 is a flowchart showing respective steps of a cooling method in the first example of the thermal processing apparatus.

Next, a cooling method in the thermal processing apparatus as structure above is described with reference to FIGS. 2 and 3. FIG. 2 is a graph showing a relationship between a temperature of a gas flowing into the heat exchanger when the processing vessel is cooled, and a flow rate of a gas for lowering temperature. FIG. 3 is a flowchart showing respective steps of the cooling method in the first example of the thermal processing apparatus. In FIG. 2, the curve A represents the temperature of the gas in a conventional apparatus without using the temperature-lowering gas, and the curve B represents the temperature of the gas in the first example of the thermal processing apparatus according to the present invention using the temperature-lowering gas.

Herein, the heat resistance temperature of the heat exchanger 54 is set at, e.g., 300° C. When the thermocouple 66 measures a temperature of t1° C., which is slightly lower than 300° C., introduction of the temperature-lowering gas is started, and when the thermocouple 66 measures a temperature of t2° C., which is lower than 300° C. after the peak of the temperature, the introduction of the temperature-lowering gas is stopped. The temperatures t1° C. and t2° C. are empirically obtained, and are set as temperatures lower than the heat resistance temperature of 300° C. by 5° C. to 40° C., for example. The temperatures t1° C. and t2° C. may vary depending on an amount of the temperature-lowering gas sent per unit time.

Immediately after a thermal process to the semiconductor wafers W inserted in the processing vessel 4 has been finished, the processing vessel 4 and the semiconductor wafers W contained therein, which have been heated by the resistance heater 34 of the heating furnace 30, are heated at about 500° C., for example, which depends on the process manner. The thermal process may be of a type including a CVD (Chemical Vapor Deposition) process, an oxidation and diffusion process, and an annealing process.

After the thermal process has been finished as described above, it is necessary to rapidly cool the semiconductor wafers W to a temperature at which the semiconductor wafers W can be unloaded from the processing vessel 4, while maintaining an appropriate temperature-lowering speed for preventing generation of slips on the semiconductor wafers W, in order to improve a product throughput.

A general, schematic flow is firstly described. Upon the start of the cooing method, the exhaust shutter 50 disposed on the outlet port 48 of the heating furnace 30 is opened, and the operation of the blowing fan 44 of the cooling-gas introduction unit 36 is started (S1). Then, a room-temperature air as the cooling gas flows through the cooling-gas introduction passage 42 to reach the fan header 43, and the room-temperature air is jetted from the respective gas nozzles 46 disposed on the fan header 43 into the cooling space 28. The jetted cooling gas of a room temperature is brought into contact with the processing vessel 4 of a high temperature, i.e., the outer peripheral surface of the outer tube 8 to cool the same. In accordance therewith, the inner tube 6 and the semiconductor wafers W inside the inner tube 6 are sequentially cooled.

The temperature of the cooling gas is raised by the cooling operation, and the high-temperature cooling gas flows into the gas discharge passage 52 of the cooling-gas discharge unit 38 through the outlet port 48 in the ceiling part. When the temperature of the cooling gas flowing through the gas discharge passage 52 is higher than the predetermined temperature, the operation of the fan for lowering temperature 64 of the temperature-lowering-gas introduction passage 58 is started, and the valve 62 on the temperature-lowering-gas introduction passage 58 is opened. Thus, the temperature-lowering gas, i.e., a room-temperature gas is mixed with the cooling gas of a high temperature, whereby the temperature of the mixed gas is lowered. The mixed gas whose temperature has been lowered flows into the heat exchanger 54. In the heat exchanger 54, the mixed gas is further cooled by a cooling medium, and is discharged outside from the suction fan 56.

Next, the aforementioned operation is described in more detail. As described above, when the operation of the blowing fan 44 is started (S1), a room-temperature air as the cooling gas flows into the cooling space 28, so that the cooling of the processing vessel 4 is started. As shown in FIG. 2, at an initial stage of the start of the cooling, since a low-temperature air remaining in the gas discharge passage 52 flows, the temperature of the air flowing into the heat exchanger 54 is low at the initial stage. However, since the air in the cooling space 28 gradually flows into the heat exchanger 54, the temperature of the air is suddenly raised for a short time. The temperature of the air (cooling gas) flowing through the gas discharge passage 52 is measured by the thermocouple 66 disposed thereon, and is inputted to the valve controller 68.

When the measured temperature value is lower than t1° C. (NO in S2), the above operation is continued. When the measured temperature value is not less than t1° C. (YES in S2), the valve 62 of the temperature-lowering-gas introduction unit 40 is opened, and the operation of the fan for lowering temperature 64 is started, so as to start sending of the temperature-lowering gas, i.e., a room-temperature air (S3). Simultaneously therewith, the operation of the suction fan 56 is started so as to start sucking of the cooling gas (S3). The temperature-lowering gas flows through the temperature-lowering-gas introduction passage 58 and passes through the opened valve 62 so as to reach the mixer 60. In the mixer 60, the temperature-lowering-gas is mixed with the air (cooling gas) whose temperature has been raised, which has flowed from the gas discharge passage 52, whereby the temperature of the mixed gas is lowered. Then, the mixed gas flows downstream by the suction fan 56. A flow rate of the temperature-lowering gas introduced at this time is constant, and the flow rate Qb [m³/min] is previously determined by the following expression.

$$Qb = Qa \cdot (Ta-Tp)/(Tp-Tr)$$

wherein:

Qa: flow rate [m³/min] of gas flowing through gas discharge passage;

Ta: maximum value [° C.] of cooling gas of conventional apparatus (see, FIG. 2);

Tp: heat resistance temperature [° C.] of heat exchanger (see, FIG. 2); and

Tr: room temperature [° C.].

In this case, the measured temperature value measured by the thermocouple 66 changes as follows. Namely, the temperature of the mixed gas is raised for a while after the introduction of the temperature-lowering gas. Then, the measured temperature value reaches the peak for a short period of time (YES in S4). Thereafter, the temperature of the mixed gas is gradually lowered. The peak point corresponds to the peak of the curve A in FIG. 2. In this case, the peak value of the curve B is lower than the heat resistance temperature Tp (300° C.) of the heat exchanger 54, whereby the heat exchanger 54 can be prevented from being thermally damaged. Thus, as the heat exchanger 54, it is not necessary to use a special heat-resistant heat exchanger, and thus a small-sized, versatile, and inexpensive heat exchanger can be used.

When the temperature of the mixed gas is not more than t2° C. (YES in S5), the valve controller 68 stops the fan for lowering temperature 64 and closes the valve 62, so as to stop the introduction of the temperature-lowering gas (S6). The value of the t2° C. is empirically obtained, and may be set at a temperature of the mixed gas when the temperature of the processing vessel 4 is lowered to a temperature equal to the heat resistance temperature Tp of the heat exchanger 54.

Then, after the introduction of the temperature-lowering gas has been stopped, it is judged whether a predetermined time has passed or not (S7). The length of the predetermined time is empirically obtained, and may be set such that the temperature of the cooling gas flowing through the gas discharge passage 52 is lowered to the safety temperature upon the elapse of the time length. After the predetermined time has passed (YES in S7), the drive of the blowing fan 44 is stopped, the drive of the suction fan 56 is stopped, and the exhaust shutter 50 is closed (S8), so as to complete the cooling operation. Thereafter, the cooled semiconductor wafers W are moved downward and unloaded from the processing vessel 4.

According to the present invention, in the thermal processing apparatus configured to carry out a thermal process to a plurality of objects to be processed at the same time, the temperature-lowering gas is mixed with the cooling gas whose temperature has been raised by the heat exchange with the processing vessel 4, at a position on the upstream side of the heat exchanger 54. Thus, it is not necessary to use a special, expensive heat exchanger resistive to a high temperature, and it is possible to use a versatile, inexpensive heat exchanger having a lower heat resistance.

In the above example, the operation of the valve 62 disposed on the temperature-lowering-gas introduction passage 58 is only the opening and closing operation. However, instead thereof, a valve whose opening degree can be adjusted may be used. When such a valve whose opening degree can be adjusted is used, as shown by the feature C illustrated by the one-dot chain lines in FIG. 2, for example, after the valve 62 has been fully opened and sometime has passed (e.g., after a time point at which the temperature passes the peak Ta), the flow rate of the temperature-lowering gas can be gradually decreased by decreasing the valve opening degree little by little.

In addition, in the above first example, the fan for lowering temperature 64 is disposed as a part of the temperature-lowering-gas introduction unit 40 so as to promote the introduction of the temperature-lowering gas. However, not limited thereto, the fan for lowering temperature 64 may be omitted, and an end of the temperature-lowering-gas introduction passage 58 may be opened to an atmospheric side such as an inside of a clean room. In this case, the inside of the temperature-lowering-gas introduction passage 58 becomes a negative pressure, by operating the suction fan 56. Thus, the temperature-lowering gas can be introduced similarly to the above by controlling the valve 62.

Second Example

Next, a second example of the thermal processing apparatus according to the present invention will be described. In the above example 1, the temperature-lowering-gas introduction unit 40 is equipped with a gas-temperature measuring unit formed of the thermocouple 66, in order that a temperature of the gas flowing into the heat exchanger is measured. However, not limited thereto, the provision of the gas-temperature measuring unit may be omitted.

Figure 4:
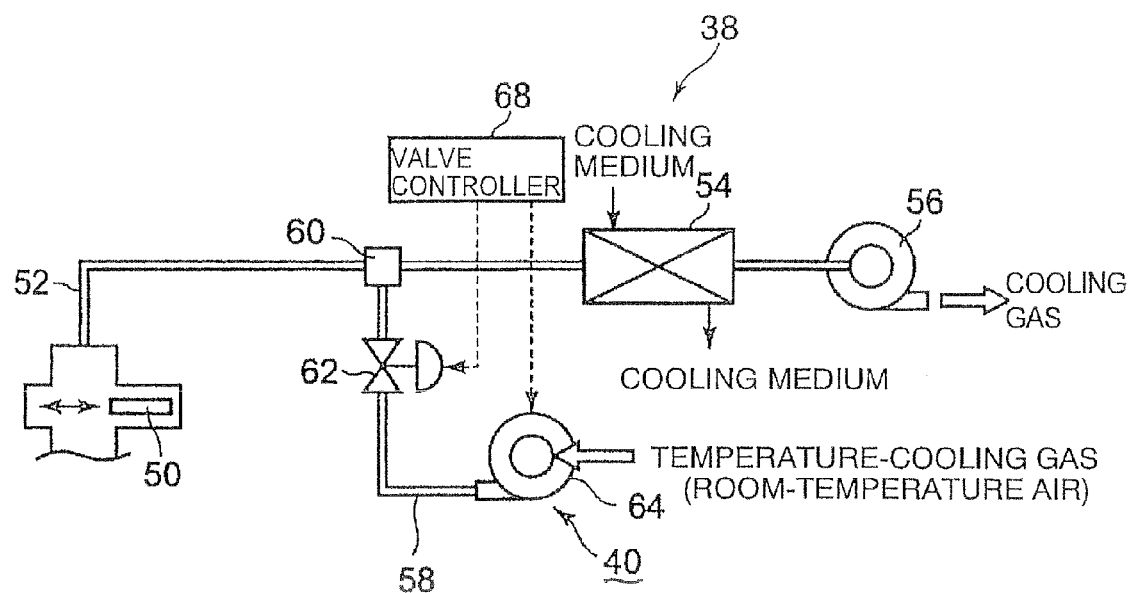
FIG. 4 is a structural view partially showing a second example of the thermal processing apparatus according to the present invention.

FIG. 4 is a structural view partially showing a second example of the thermal processing apparatus according to the present invention. In FIG. 4, the same constituent parts as those shown in FIG. 1 are shown by the same reference numbers, and detailed description thereof is omitted. As shown in FIG. 4, the gas discharge passage 52 is not equipped with a gas-temperature measuring unit formed of the thermocouple 66, which is shown in FIG. 1. In this case, the valve controller 68 receives a command for starting a cooling operation from the apparatus controller 70, and performs the opening and closing operation of the valve 62 and the starting and stopping operation of the fan for lowering temperature 64, based on a time management.

To be specific, the respective timings (time) of the temperatures t1 and t2 shown in FIG. 2 can be experimentally or empirically known, whereby the respective timings are previously obtained as data in which a start of the cooling operation is determined as a starting point. The data is stored in the valve controller 68 beforehand. Thus, the same operation as that of the first example can be performed. Also in this case, the same effect as that of the first example can be exerted. Also in the second example, similarly to the example 1 as described above, the fan for lowering temperature 64 may be omitted, and an end of the temperature-lowering-gas introduction passage 58 may be opened to an atmospheric side such as an inside of a clean room. In this case, the inside of the temperature-lowering-gas introduction passage 58 becomes a negative pressure, by operating the suction fan 56. Thus, the temperature-lowering gas can be introduced similarly to the above by controlling the valve 62.

Third Embodiment

Figure 5:
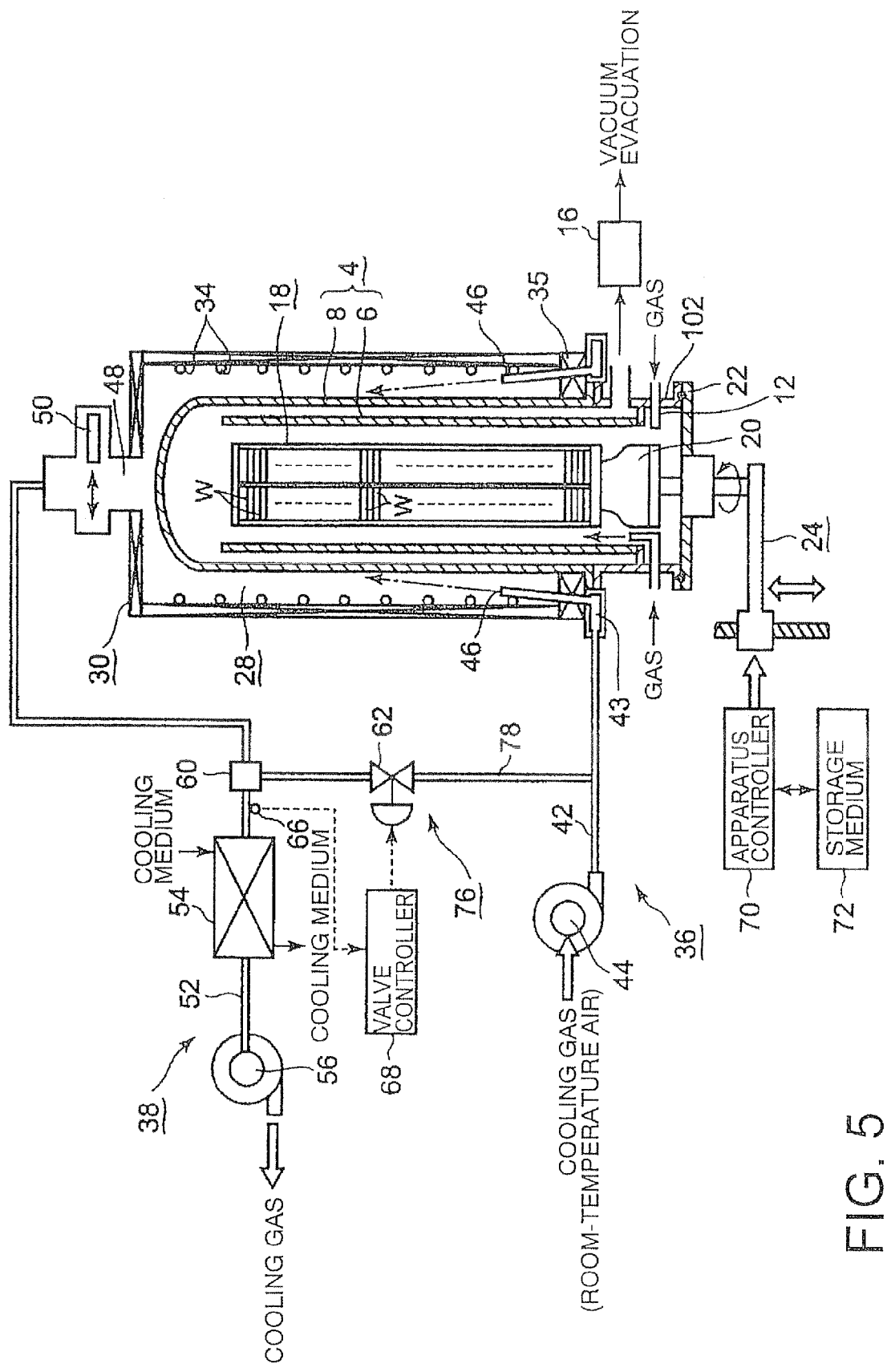
FIG. 5 is a structural view showing a third example of the thermal processing apparatus according to the present invention.
Figure 6:
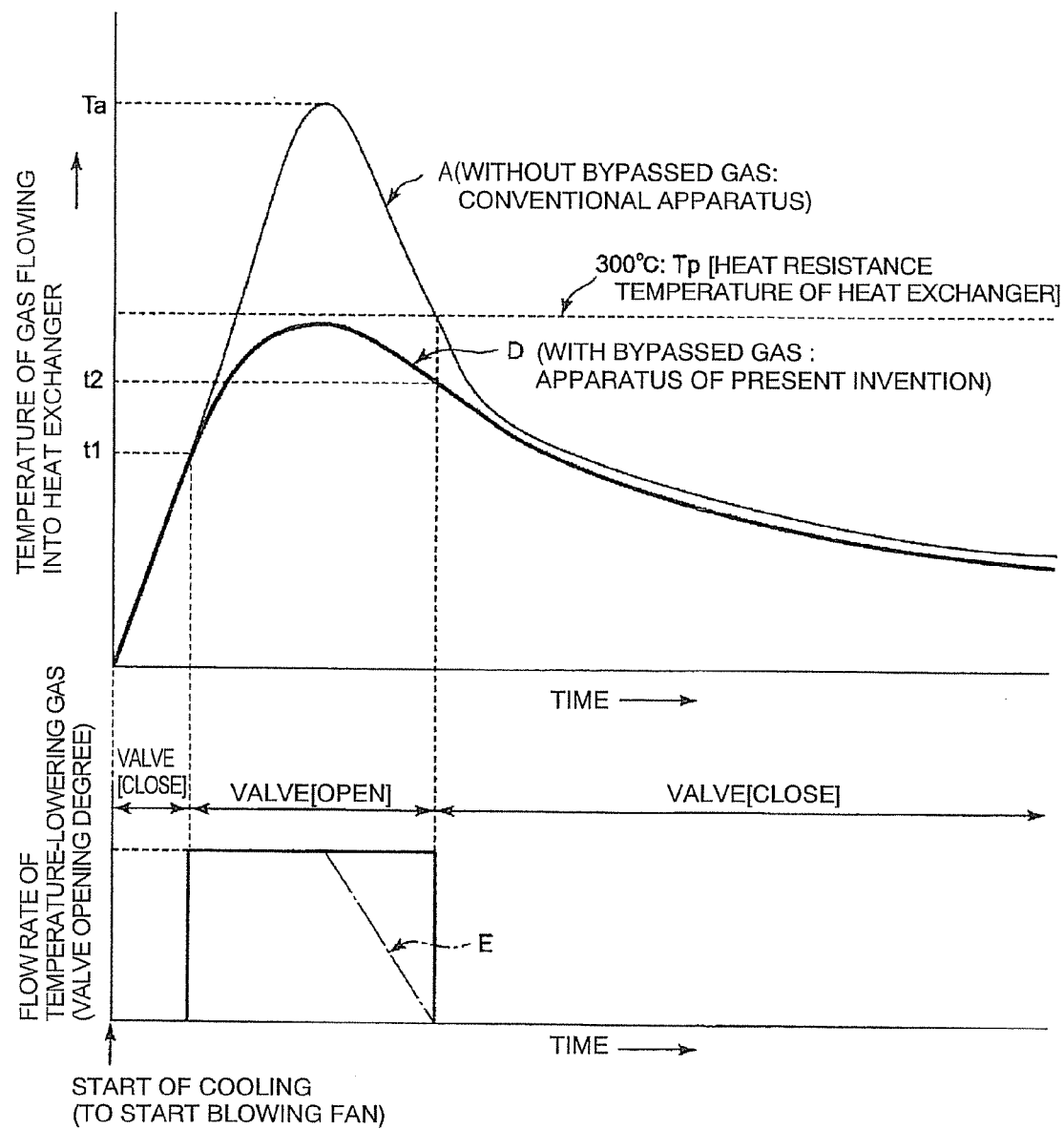
FIG. 6 is a graph showing a relationship between a temperature of a gas flowing into the heat exchanger when the processing vessel is cooled, and an opening and closing operation of a valve on a bypass passage.
Figure 7:
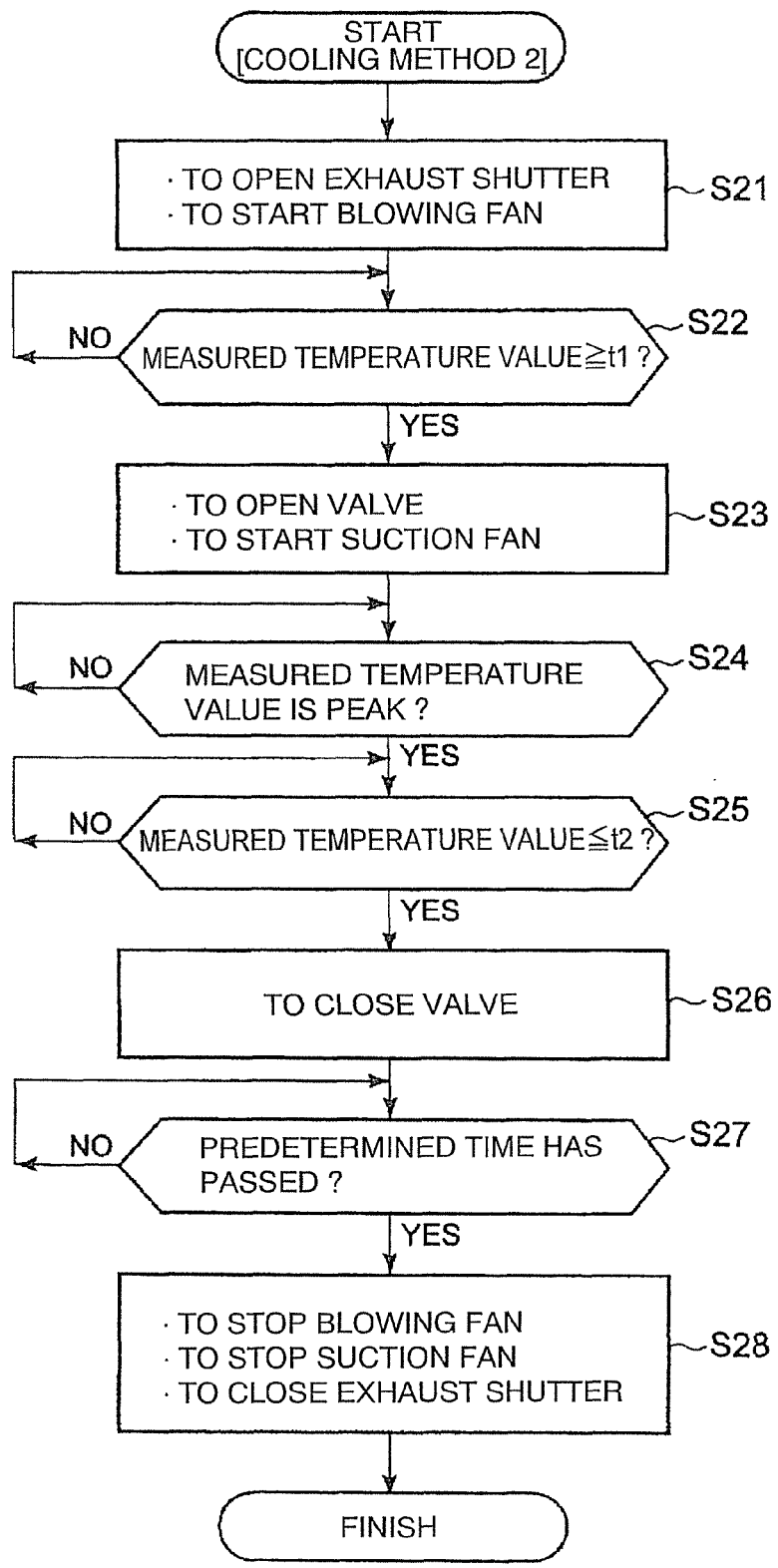
FIG. 7 is a flowchart showing respective steps of the cooling method in the third example of the thermal processing apparatus.

Next, a third example of the present invention will be described. In the first and second examples, a room-temperature air as the temperature-lowering gas is introduced from the temperature-lowering gas introduction unit 40 that is additionally provided for introducing the temperature-lowering gas. On the other hand, in the third example, a part of the cooling gas (room-temperature gas) sent from the blowing fan is bypassed, and the bypassed cooling gas is introduced into and mixed with the cooling gas whose temperature has been raised during the passage of the cooling space. FIG. 5 is a structural view showing the third example of the thermal processing apparatus according to the present invention. FIG. 6 is a graph showing a relationship between a temperature of a gas flowing into the heat exchanger when the processing vessel is cooled, and an opening and closing operation of a valve on a bypass passage. FIG. 7 is a flowchart showing respective steps of the cooling method in the third example of the thermal processing apparatus.

In FIG. 6 the curve A represents the temperature of the gas in a conventional apparatus without using the bypassed cooling gas, and the curve D represents the temperature of the gas in the third example of the thermal processing apparatus according to the present invention using the bypassed cooling gas. In FIGS. 5 to 7, the same constituent parts as those shown in FIGS. 1 to 3 are shown by the same reference numbers, and detailed description thereof is omitted.

As shown in FIG. 5, in place of the temperature-lowering-gas introduction passage 58 which is provided in the first and second examples, there is provided a bypass unit 76 configured to bypass a part of the cooling gas according to need. Specifically, the bypass unit 76 includes a bypass passage 78 that communicates the gas introduction passage 42 of the cooling-gas introduction unit 36 and the gas discharge passage 52 of the cooling-gas discharge unit 38 with each other. In this case, one end of the bypass passage 78 is connected to the gas introduction passage 42 at a position on the downstream side of the blowing fan 44, and the other end of the bypass passage 78 is connected to the gas discharge passage 52 at a position upstream side of the heat exchanger 54. The mixer 60 is disposed on a connection point at which the bypass passage 78 and the gas discharge passage 52 are connected to each other.

The bypass passage 78 is provided with a valve 62 by which a flow of the gas to be bypassed is controlled. As a gas-temperature measuring unit for measuring a temperature of a mixed gas, which is a mixture of the cooling gas whose temperature has been raised during the passage of the cooling space and the gas having flown through the bypass passage 78, the thermocouple 66 is disposed on the gas discharge passage 52 at a position between the heat exchanger 54 and the mixer 60. Namely, the thermocouple 66 is configured to measure a temperature of the gas flowing into the heat exchanger 54. Similarly to the first and second examples, the valve controller 68 is configured to control the valve 62, such that a temperature of the gas becomes a predetermined temperature or less, based on a measured temperature value measured by the thermocouple 66 as the gas-temperature measuring unit.

<Description of Cooling Method>

The operation of the third example is substantially the same as the operation of the first example, excluding the operation of the fan for lowering temperature 64. S21 to S28 in FIG. 7 correspond to S1 to S8 in FIG. 3, respectively.

A general, schematic flow is firstly described. At first, the bypass valve 62 is closed. When the cooling operation is started, the exhaust shutter 50 disposed on the outlet port 48 of the heating furnace 30 is opened, and the operation of the blowing fan 44 of the cooling-gas introduction unit 36 is started (S21). Then, a room-temperature air as the cooling gas flows through the gas introduction passage 42 to reach the fan header 43. The room-temperature air is jetted from the respective gas nozzles 46 disposed on the fan header 43 into the cooling space 28. The jetted cooling gas of a room temperature is brought into contact with the processing vessel 4 of a high temperature, i.e., the outer peripheral surface of the outer tube 8 to cool the same. In accordance therewith, the inner tube 6 and the semiconductor wafers W inside the inner tube 6 are sequentially cooled.

The temperature of the cooling gas is raised by the cooling operation, and the high-temperature cooling gas flows into the gas discharge passage 52 of the cooling-gas discharge unit 38 through the outlet port 48 in the ceiling part. When the temperature of the cooling gas flowing through the gas discharge passage 52 is higher than the predetermined temperature, the valve 62 disposed on the bypass passage 78 is opened, so that a part of the cooling gas flowing through the gas introduction passage 42 is bypassed to flow into the bypass passage 78. Then, the gas is mixed with the cooling gas whose temperature has been raised during the passage of the cooling space 28, so that the temperature of the mixed gas is lowered. Then, the mixed gas whose temperature has been lowered flows into the heat exchanger 54. In the heat exchanger 54, the mixed gas is further cooled by a cooling medium, and is discharged outside from the suction fan 56.

Next, the aforementioned operation is described in more detail. As described above, when the operation of the blowing fan 44 is started (S21), a room-temperature air as the cooling gas flows into the cooling space 28, so that the cooling of the processing vessel 4 is started. As shown in FIG. 6, at an initial stage of the start of the cooling, since a low-temperature air remaining in the gas discharge passage 52 flows, the temperature of the air flowing into the heat exchanger 54 is low at the initial stage. However, since the air in the cooling space 28 gradually flows into the heat exchanger 54, the temperature of the air is suddenly raised for a short time. The temperature of the air (cooling gas) flowing through the gas discharge passage 52 is measured by the thermocouple 66 disposed thereon, and is inputted to the valve controller 68.

When the measured temperature value is lower than t1° C. (NO in S22), the above operation is continued. When the measured temperature value is not less than t1° C. (YES in S22), the valve 62 disposed on the bypass passage 78 is opened, so that a part of the cooling gas flowing through the gas introduction passage 42 is bypassed. Simultaneously therewith, the operation of the suction fan 56 is started so as to start sucking of the cooling gas (S23). The bypassed cooling gas flows through the bypass passage 78 and passes through the opened valve 62 so as to reach the mixer 60. In the mixer 60, the cooling gas is mixed with the air (cooling gas) whose temperature has been raised, which has flowed from the gas discharge passage 52, whereby the temperature of the mixed gas is lowered. Then, the mixed gas flows downstream by the suction fan 56. Although depending on the apparatus design, a flow rate of the cooling gas which is diverged to flow into the bypass passage 78 at this time is about a half of the total flow rate of the cooling gas sent by the blowing fan 44.

The measured temperature value measured by the thermocouple 66 changes as follows. Namely, the temperature of the mixed gas is raised for a while after the introduction of the bypassed cooling gas. Then, the measured temperature value reaches a peak for a short period of time (YES in S24). Thereafter, the temperature of the mixed gas is gradually lowered. The peak point corresponds to a peak of the curve A in FIG. 6. In this case, the peak value of the curve D is lower than the heat resistance temperature Tp (300° C.) of the heat exchanger 54, whereby the heat exchanger 54 can be prevented from being thermally damaged. Thus, as the heat exchanger 54, it is not necessary to use a special heat-resistant heat exchanger, and thus a small-sized, versatile, and inexpensive heat exchanger can be used.

When the temperature of the mixed gas is not more than t2° C. (YES in S25), the valve controller 68 closes the valve 62, so as to stop the introduction of the bypassed gas (S26). The value of the t2° C. is empirically obtained, and may be set at a temperature of the mixed gas when the temperature of the processing vessel 4 is lowered to a temperature equal to the heat resistance temperature Tp of the heat exchanger 54.

Then, after the introduction of the temperature-lowering gas has been stopped, it is judged whether a predetermined time has passed or not (S27). Similarly to the first and second examples, the length of the predetermined time is empirically obtained, and may be set such that the temperature of the cooling gas flowing through the gas discharge passage 52 is lowered to the safety temperature upon the elapse of the time length. After the predetermined time has passed (YES in S27), the operation of the blowing fan 44 is stopped, the operation of the suction fan 56 is stopped, and the exhaust shutter 50 is closed (S28), so as to complete the cooling operation. Thereafter, the cooled semiconductor wafers W are lowered and unloaded from the processing vessel 4.

According to the present invention, in the thermal processing apparatus configured to thermally process a plurality of objects to be processed at the same time, a part of the cooling gas toward the processing vessel 4 is bypassed, and the bypassed cooling gas is mixed with the cooling gas whose temperature has been raised by the heat exchange with the processing vessel 4, at a position on the upstream side of the heat exchanger. Thus, it is not necessary to use a special, expensive heat exchanger resistive to a high temperature, and it is possible to use a versatile, inexpensive heat exchanger having a lower heat resistance.

In the above example, the operation of the valve 62 disposed on the bypass passage 78 is only the opening and closing operation. However, instead thereof, a valve whose opening degree can be adjusted may be used. When such a valve whose opening degree can be adjusted is used, as shown by the feature E illustrated by one-dot chain liens in FIG. 6, for example, after the valve 62 has been fully opened and a some time has passed (e.g., after a time point at which the temperature passes the peak Ta), the flow rate of the temperature-lowering gas can be gradually decreased by decreasing the valve opening degree little by little.

Fourth Example

Next, a fourth example of the thermal processing apparatus according to the present invention will be described. In the third example, the bypass unit 76 is equipped with the gas-temperature measuring unit formed of the thermocouple 66 for measuring the temperature of the mixed gas. However, not limited thereto, the gas-temperature measuring unit may be omitted. In this case, similarly to the second example, the valve controller 68 receives a command for starting a cooling operation from the apparatus controller 70, and performs the opening and closing operation of the valve 62, based on a time management.

To be specific, the respective timings (time) of the temperatures t1 and t2 can be experimentally or empirically known, whereby the respective timings are previously obtained as data in which a start of the cooling operation is determined as a starting point. The data is stored in the valve controller 68 beforehand. Thus, the same operation as that of the third example can be performed. Also in this case, the same effect as that of the third example can be exerted.

In the third and fourth examples, since the flow rate of the cooling gas to be introduced to the cooling space 28 during the cooling operation is smaller than the flow rate of the cooling gas in the first and second examples, the cooling speed is decelerated. However, since the flow rate of the gas flowing through the blowing fan 44 and the suction fan 56 are always the same, the fans of the same blowing capacity can be advantageously used.

In the respective examples, as the cooling gas or the temperature-lowering gas, a room-temperature air is used. However, not limited thereto, air whose temperature has been previously cooled to a temperature lower than a room temperature can be used. Alternatively, instead of air, an inert gas such as $N_2$ gas or He gas may be used.

In the respective examples, the processing vessel 4 of a dual tube structure is described by way of example. However, this processing vessel is a mere example, and a processing vessel of a single tube structure may be used. In addition, the structure of the gas introduction unit 12 is not limited to the above example.

Further, as the objects to be processed, although the semiconductor wafers are described by way of example, the semiconductor wafers include silicon substrates and semiconductor substrates made of compound such as GaAs, SiC, or GaN. Furthermore, not limited to these substrates, the present invention can be applied to glass substrates for use in liquid crystal display devices and ceramic substrates.

The invention claimed is:

1. A thermal processing apparatus configured to thermally process a plurality of objects to be processed, the thermal processing apparatus comprising:
   a processing vessel;
   a support unit capable of being moved to be loaded into and unloaded from the processing vessel, while supporting the plurality of objects to be processed;
   a heating furnace disposed outside the processing vessel to surround the processing vessel, with a cooling space through which a gas can pass, being defined between the heating furnace and the processing vessel;
   a cooling-gas introduction unit disposed on the heating furnace, the cooling-gas introduction unit including a blowing fan and a gas introduction passage, for introducing a cooling gas for cooling the processing vessel into the cooling space;
   a cooling-gas discharge unit disposed on the heating furnace, the cooling-gas discharge unit including a gas discharge passage, a heat exchanger, and a suction fan, for discharging the cooling gas of a raised temperature from the cooling space; and
   a temperature-lowering gas introduction unit disposed between the cooling space and the heat exchanger,
   wherein the gas discharge passage extends outside from the heating furnace to the heat exchanger, and
   a mixer is disposed on a connection position of the gas discharge passage between the heating furnace and the heat exchanger, at which the gas discharge passage and the temperature-lowering-gas introduction passage are connected to each other, and the temperature-lowering gas and the cooling gas are mixed with each other.

2. The thermal processing apparatus according to claim 1, wherein:
   the heating furnace is disposed on an outer peripheral side of the processing vessel to surround the processing vessel, with the cooling space of a predetermined width being defined between the heating furnace and the processing vessel;
   the heat exchanger and the suction fan of the gas discharge passage are arranged in this order from an upstream side to a downstream side; and
   the temperature-lowering-gas introduction unit is disposed on the gas discharge passage at a position on an upstream side of the heat exchanger, and is configured to introduce a temperature-lowering gas to be mixed with the cooling gas of a raised temperature so as to lower a temperature thereof.

3. The thermal processing apparatus according to claim 1, wherein
   the temperature-lowering-gas introduction unit includes:
   a temperature-lowering-gas introduction passage connected to the gas discharge passage;
   a valve disposed on the temperature-lowering-gas introduction passage, the valve being configured to control a flow of the temperature-lowering gas;
   a gas-temperature measuring unit disposed on the gas discharge passage at a position on an upstream side of the heat exchanger, the gas-temperature measuring unit being configured to measure a temperature of a gas flowing into the heat exchanger; and
   a valve controller configured to control the valve such that a temperature of the gas flowing into the heat exchanger becomes a predetermined temperature or less, based on a measured temperature value of the gas-temperature measuring unit.

4. The thermal processing apparatus according to claim 3, wherein
   the valve is an opening and closing valve whose valve opening degree can be adjusted.

5. The thermal processing apparatus according to claim 1, wherein
   the temperature-lowering-gas introduction unit includes:
   a temperature-lowering-gas introduction passage connected to the gas discharge passage;
   a fan for lowering temperature connected to the temperature-lowering-gas introduction passage;
   a valve disposed on the temperature-lowering-gas introduction passage, the valve being configured to control a flow of the temperature-lowering gas; and
   a valve controller configured to control the valve such that a temperature of the gas flowing into the heat exchanger becomes a predetermined temperature or less, based on a preset time period in which a start of a cooling operation is determined as a starting point.

6. The thermal processing apparatus according to claim 5, wherein
   the valve is an opening and closing valve whose valve opening degree can be adjusted.

7. The thermal processing apparatus according to claim 5, wherein
   a mixer is disposed on a connection position at which the gas discharge passage and the temperature-lowering-gas introduction passage are connected to each other.

8. A thermal processing apparatus configured to thermally process a plurality of objects to be processed, the thermal processing apparatus comprising:
   a processing vessel;
   a support unit capable of being moved to be loaded into and unloaded from the processing vessel, while supporting the plurality of objects to be processed;
   a heating furnace disposed outside the processing vessel to surround the processing vessel, with a cooling space through which a gas can pass being defined between the heating furnace and the processing vessel;
   a cooling-gas introduction unit disposed on the heating furnace, the cooling-gas introduction unit including a blowing fan and a gas introduction passage, for introducing a cooling gas for cooling the processing vessel into the cooling space;
   a cooling-gas discharge unit disposed on the heating furnace, the cooling-gas discharge unit including a gas discharge passage, a heat exchanger, and a suction fan, for discharging the cooling gas of a raised temperature from the cooling space; and a bypass unit, including a bypass passage, configured to communicate the gas introduction passage and the gas discharge passage so as to bypass a part of the cooling gas, wherein the gas discharge passage extends outside from the heating furnace to the heat exchanger, and a mixer is disposed on a connection position of the gas discharge passage between the heating furnace and the heat exchanger, at which gases in the gas discharge passage and the bypass passage are mixed with each other.

9. The thermal processing apparatus according to claim 8, wherein:

the heating furnace is disposed on an outer peripheral side of the processing vessel to surround the processing vessel, with the cooling space of a predetermined width being defined between the heating furnace and the processing vessel; and the heat exchanger and the suction fan of the gas discharge passage are arranged in this order from an upstream side to a downstream side.

10. The thermal processing apparatus according to claim 8, wherein:

the bypass unit includes:

a bypass passage that communicates a downstream side of the blowing fan of the gas introduction passage and an upstream side of the heat exchanger disposed on the gas discharge passage with each other;

a valve disposed on the bypass passage; the valve being configured to control a flow of a bypassed gas;

a gas-temperature measuring unit configured to measure a temperature of a gas flowing into the heat exchanger; and a valve controller configured to control the valve such that a temperature of the gas becomes a predetermined temperature or less, based on a measured temperature value of the gas-temperature measuring unit.

11. The thermal processing apparatus according to claim 10, wherein the valve is an opening and closing valve whose valve opening degree can be adjusted.

12. The thermal processing apparatus according to claim 8, wherein the bypass unit includes:

a bypass passage that communicates a downstream side of the blowing fan of the gas introduction passage and an upstream side of the heat exchanger disposed on the gas discharge passage with each other;

a valve disposed on the bypass passage; the valve being configured to control a flow of a bypassed gas; and a valve controller configured to control the valve such that a temperature of a mixed gas, which is a mixture of the cooling gas having flowed through the cooling space and the gas having flowed through the bypass passage, becomes a predetermined temperature or less, based on a preset time period in which a start of a cooling operation is determined as a starting point.

13. The thermal processing apparatus according to claim 12, wherein the valve is an opening and closing valve whose valve opening degree can be adjusted.

14. The thermal processing apparatus according to claim 12, wherein a mixer is disposed on a connection position at which the gas discharge passage and the bypass passage are connected to each other.

15. A method of cooling a thermal processing apparatus configured to thermally process a plurality of objects to be processed, the method comprising:

introducing a cooling gas into a cooling space of a predetermined width defined between a cylindrical processing vessel containing the objects to be processed and a heating furnace, the heating furnace being disposed to surround an outer peripheral side of the processing vessel for heating the objects to be processed, so as to cool the processing vessel, while discharging the cooling gas of a raised temperature; and introducing a temperature-lowering gas into the cooling gas of a raised temperature, which has been discharged from the cooling space, so as to mix the gases with each other, whereby a temperature of the mixed gas becomes a predetermined temperature or less, the thermal processing apparatus comprising:

the processing vessel;

a support unit capable of being moved to be loaded into and unloaded from the processing vessel, while supporting the plurality of objects to be processed;

the heating furnace disposed outside the processing vessel to surround the processing vessel, with the cooling space through which gas can pass, being defined between the heating furnace and the processing vessel;

a cooling-gas introduction unit disposed on the heating furnace, the cooling-gas introduction unit including a blowing fan and a gas introduction passage, for introducing the cooling gas for cooling the processing vessel into the cooling space;

a cooling-gas discharge unit disposed on the heating furnace, the cooling-gas discharge unit including a gas discharge passage, a heat exchanger, and a suction fan, for discharging the cooling gas of a raised temperature from the cooling space; and a temperature-lowering gas introduction unit disposed between the cooling space and the heat exchanger, wherein the gas discharge passage extends outside from the heating furnace to the heat exchanger, and a mixer is disposed on a connection position of the gas discharge passage between the heating furnace and the heat exchanger, at which the gas discharge passage and the temperature-lowering-gas introduction passage are connected to each other, and the temperature-lowering gas and the cooling gas are mixed with each other.

16. The method of cooling the thermal processing apparatus according to claim 15, wherein the predetermined temperature is a heat resistant temperature of the heat exchanger disposed on a downstream side of the mixer along which the mixed gas flows.

17. A method of cooling a thermal processing apparatus configured to thermally process a plurality of objects to be processed, the method comprising:

introducing a cooling gas into a cooling space of a predetermined width defined between a cylindrical processing vessel containing the objects to be processed and a heating furnace disposed to surround an outer peripheral side of the processing vessel for heating the objects to be processed, so as to cool the processing vessel, while discharging the cooling gas of a raised temperature; and bypassing a part of the cooling gas flowing toward the cooling space and introducing the bypassed cooling gas into the cooling gas of a raised temperature, which has been discharged from the cooling space, so as to mix the gases with each other, whereby a temperature of the mixed gas becomes a predetermined temperature or less, the thermal processing apparatus comprising:

the processing vessel;

a support unit capable of being moved to be loaded into and unloaded from the processing vessel, while supporting the plurality of objects to be processed;

the heating furnace disposed outside the processing vessel to surround the processing vessel, with the cooling space through which gas can pass being defined between the heating furnace and the processing vessel;

a cooling-gas introduction unit disposed on the heating furnace, the cooling-gas introduction unit including a blowing fan and a gas introduction passage, for introducing the cooling gas for cooling the processing vessel into the cooling space;

a cooling-gas discharge unit disposed on the heating furnace, the cooling-gas discharge unit including a gas discharge passage, a heat exchanger, and a suction fan, for discharging the cooling gas of a raised temperature from the cooling space; and a bypass unit, including a bypass passage, configured to communicate the gas introduction passage and the gas discharge passage so as to bypass a part of the cooling gas, wherein the gas discharge passage extends outside from the heating furnace to the heat exchanger, and a mixer is disposed on a connection position of the gas discharge passage between the heating furnace and the heat exchanger, at which gases in the gas discharge passage and the bypass passage are mixed with each other.

18. The method of cooling the thermal processing apparatus according to claim 17, wherein the predetermined temperature is a heat resistant temperature of the heat exchanger disposed on a downstream side of the mixer along which the mixed gas flows.

* * * * *